(12) United States Patent
Gaku et al.

(10) Patent No.: US 8,377,544 B2
(45) Date of Patent: Feb. 19, 2013

(54) GLASS FABRIC BASE MATERIAL/THERMOSETTING RESIN COPPER-CLAD LAMINATE HAVING A HIGH-ELASTICITY

(75) Inventors: Morio Gaku, Tokyo (JP); Hidenori Kimbara, Tokyo (JP); Nobuyuki Ikeguchi, Tokyo (JP); Masakazu Motegi, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 12/907,089

(22) Filed: Oct. 19, 2010

(65) Prior Publication Data

US 2011/0033659 A1 Feb. 10, 2011

Related U.S. Application Data

(62) Division of application No. 11/296,329, filed on Dec. 8, 2005, now abandoned, which is a division of application No. 09/625,493, filed on Jul. 25, 2000, now abandoned.

(30) Foreign Application Priority Data

Jul. 29, 1999 (JP) .................................. 11-215850

(51) Int. Cl.
*B32B 9/00* (2006.01)
*B32B 17/04* (2006.01)

(52) U.S. Cl. ....... 428/209; 428/297.4; 442/70; 442/175; 442/180; 442/182; 174/258; 174/266

(58) Field of Classification Search .................. 428/209, 428/297.4; 174/250–255, 258, 266; 442/70, 442/175, 180, 182
See application file for complete search history.

(56) References Cited

U.S. PATENT DOCUMENTS

| | | | |
|---|---|---|---|
| 4,940,842 A | 7/1990 | Schultz et al. | |
| 4,959,119 A * | 9/1990 | Lantzer | 216/65 |
| 5,126,192 A * | 6/1992 | Chellis et al. | 428/323 |
| 5,368,921 A | 11/1994 | Ishii et al. | |
| 5,817,404 A | 10/1998 | Kawakita et al. | |
| 5,888,627 A * | 3/1999 | Nakatani | 428/209 |
| 6,042,936 A * | 3/2000 | Kempf | 428/323 |
| 6,245,696 B1 * | 6/2001 | Haas et al. | 442/348 |
| 6,337,463 B1 | 1/2002 | Gaku et al. | |
| 6,359,235 B1 * | 3/2002 | Hayashi | 174/260 |
| 6,362,436 B1 | 3/2002 | Kimbara et al. | |
| 6,459,046 B1 * | 10/2002 | Ochi et al. | 174/256 |
| 6,479,760 B2 | 11/2002 | Kimbara et al. | |

FOREIGN PATENT DOCUMENTS

| | | |
|---|---|---|
| EP | 0 569 242 | 11/1993 |
| EP | 0 642 919 | 3/1995 |
| EP | 0 768 814 | 4/1997 |
| JP | 63 019245 | 1/1988 |
| JP | 0 355 810 | 2/1990 |
| JP | 3-8832 | 1/1991 |
| JP | 04239520 | 8/1992 |
| JP | 8-060484 | 3/1996 |
| JP | 10-157012 | 6/1998 |
| JP | 11-54914 | 2/1999 |
| JP | 11-77892 | 3/1999 |

OTHER PUBLICATIONS

Patent Abstracts of Japan, vol. 013, No. 373, Aug. 18, 1989, Abstract of JP 56 127335, May 19, 1989.
Patent Abstracts of Japan, vol. 005, No. 152, Sep. 25, 1981, Abstract of JP 56 084726, Jul. 10, 1981.
Japanese Notification of Reason for Rejection issued Mar. 31, 2009 in corresponding Japanese Patent Application No. 215850/1999.

* cited by examiner

*Primary Examiner* — Cathy Lam
(74) *Attorney, Agent, or Firm* — Wenderoth, Lind & Ponack, L.L.P.

(57) ABSTRACT

A copper-clad laminate of a highly-elastic glass fabric base material/thermosetting resin formed of prepreg obtained by impregnating a glass fabric base material made of a glass woven fabric having a thickness of 25 to 150 μm, a weight of 15 to 165 g/m² and a gas permeability of 1 to 20 cm³/cm²/sec. with a thermosetting resin composition and drying it.

2 Claims, No Drawings

GLASS FABRIC BASE MATERIAL/THERMOSETTING RESIN COPPER-CLAD LAMINATE HAVING A HIGH-ELASTICITY

This application is a divisional of application Ser. No. 11/296,329, filed Dec. 8, 2005 now abandoned, which is a divisional application of Ser. No. 09/625,493, filed Jul. 25, 2000, now abandoned.

FIELD OF THE INVENTION

The present invention relates to a highly-elastic glass fabric base copper-clad laminate. Further, it relates to a high-density glass fabric base copper-clad laminate suitable for the formation of a remarkable small-diameter penetration hole and/or via hole by irradiation with a high-output carbon dioxide gas laser in place of a mechanical drill. A printed wiring board comprising the above copper-clad laminate is suitably used mainly for a semiconductor plastic package such as a thin and small chip scale package (CSP).

PRIOR ART OF THE INVENTION

A conventional base material for the thin chip scale package (CSP) is mainly selected from thin sheets formed of a glass epoxy material, a polyimide film material and a ceramic material. In packages formed of these sheets, a solder ball/solder ball distance is generally 0.8 mm. In recent years, however, it is attempted to decrease the thickness, the size and the weight of a printed wiring board. Therefore, a solder ball pitch is getting smaller and smaller, so that a line/space distance is decreasing. On this account, there is required a copper-clad laminate which has an excellent surface smoothness and is suited for the formation of a fine-line circuit. Further, a penetration hole and a via hole are coming to have a small diameter, and the holes have a diameter of 0.15 mm or less. When a hole having the above small diameter is made, the problem is that the drill bents or breaks at a hole-forming time or that the processing speed is low due to the small diameter of the drill, which results in problems in productivity and reliability. Further, when there is employed a method in which holes having the same size are made in copper foils on front and reverse surfaces through negative films according to a predetermined method and a through hole reaching the front and reverse surfaces is made with a carbon dioxide gas laser, the problem is that the positions of the holes on the upper and lower surfaces deviate from each other so that it is difficult to form lands.

In a conventional method, when a via hole is made in a thermosetting resin copper-clad laminate of a glass fabric base material, a copper foil on a surface is removed by etching in advance and the via hole is made by irradiation with a low-output carbon dioxide gas laser energy. In this method, however, the problem is that fluffing remains on the wall of the via hole. In addition, the above method includes the precedent step of removing the copper foil by etching, so that workability is poor. When a hole is made with a high-output carbon dioxide gas laser energy, the processing rates of the resin layer and glass layer of a hole wall differ from each other so that the roughness of the hole wall becomes large, which impair the quality of the hole.

SUMMARY OF THE INVENTION

It is an object of the present invention to provide a glass fabric base material/thermosetting resin copper-clad laminate which is excellent in the smoothness of a surface, has a high elasticity and is almost free from a distortion and a warpage.

It is another object of the present invention to provide a glass fabric base material/thermosetting resin copper-clad laminate having a high elasticity, in which each insulation layer has a thickness of 30 to 150 μm.

It is further another object of the present invention to provide a glass fabric base material/thermosetting resin copper-clad laminate in which a small-diameter hole, of which the wall is highly reliable, can be formed with a high-output carbon dioxide gas laser at a high rate.

According to the present invention, there is provided a copper-clad laminate of a highly-elastic glass fabric base material/thermosetting resin formed of prepreg obtained by impregnating a glass fabric base material made of a glass woven fabric having a thickness of 25 to 150 μm, a weight of 15 to 165 g/m² and a gas permeability of 1 to 20 cm³/cm²/sec. with a thermosetting resin composition and drying it.

According to the present invention, further, there is provided a copper-clad laminate of a highly-elastic glass fabric base material/thermosetting resin according to the above, wherein the thermosetting resin composition contains an insulating inorganic filler in an amount of 10 to 80% by weight based on the above resin composition.

According to the present invention, further, there is provided a copper-clad laminate of a highly-elastic glass fabric base material/thermosetting resin according to the above, wherein the prepreg has a glass content of 25 to 70% by weight.

According to the present invention, further, there is provided a copper-clad laminate of a highly-elastic glass fabric base material/thermosetting resin according to the above, wherein a glass fabric base material/thermosetting resin layer of the copper-clad laminate has a thickness of 30 to 150 μm.

According to the present invention, further, there is provided a copper-clad laminate of a highly-elastic glass fabric base material/thermosetting resin according to the above, wherein the thermosetting resin composition is a resin composition containing, as an essential component, a polyfunctional cyanate ester and a prepolymer of said polyfunctional cyanate ester.

DETAILED DESCRIPTION OF THE INVENTION

The present invention relates to a highly-elastic glass fabric base material/thermosetting resin copper-clad laminate having at least one copper foil layer and laminate-formed by the use of prepreg obtained by impregnating a glass fabric base material particularly suitable for producing a thin, small and lightweight printed wiring board with a thermosetting resin composition. There have been found the following. When a glass woven fabric having a thickness of 25 to 150 μm, a weight of 15 to 165 g/m² and a gas permeability of 1 to 20 cm³/cm²/sec. is used as the above base material to prepare a copper-clad laminate having at least one copper foil layer, the laminate is excellent in surface-smoothness and has a high elasticity. And, when a hole having a small diameter is made in the laminate with a high-energy carbon dioxide gas laser, a hole wall in the laminate is uniform.

Further, there is provided a copper-clad laminate which is further excellent in elasticity and excellent in the quality of the wall of a small-diameter hole formed with a carbon dioxide gas laser due to the incorporation of an insulating inorganic filler into the thermosetting resin composition. It is further found that when a polyfunctional cyanate ester or a prepolymer of said cyanate ester as a thermosetting resin is used as an essential component, an obtained copper-clad laminate is excellent in electric insulation properties after moisture absorption, anti-migration properties and heat resistance. Further, the hole can be made in not only a double-side copper-clad laminate but also in a multi-layered laminate obtained by the use of the same resin composition. These copper-clad boards may be preferably used even when a hole is directly made with a YAG (UV) laser.

As a base material for the glass fabric base copper-clad laminate, a glass woven fabric having a thickness of 25 to 150 µm, a weight of 15 to 165 g/m$^2$ and a gas permeability of 1 to 20 cm$^3$/cm$^2$/sec. is provided. An insulating inorganic filler is added to a thermosetting resin such that the thermosetting resin composition preferably has an insulating inorganic filler content of 10 to 80% by weight, more preferably 20 to 70% by weight, and the resultant mixture is uniformly mixed. Further, a polyfunctional cyanate ester or a prepolymer of said cyanate ester as a thermosetting resin is used as an essential component, whereby the laminate itself of the copper-clad laminate increases in elasticity and the occurrence of a distortion, etc., is prevented when it is used for a particularly thin printed wiring board. In the formation of a hole with a carbon dioxide gas laser, there can be formed a small-diameter penetration hole and/or a via hole, of which the wall is uniform. And, there is obtained a copper-clad laminate which is excellent in heat resistance, electric insulation properties after moisture absorption, and anti-migration properties.

The double-side copper-clad laminate or copper-clad multi-layered board obtained by according to the present invention is a double-side copper-clad board having a uniform structure and composition, in which a glass woven fabric is used as a base material, and the thermosetting resin composition preferably contains 10 to 80 wt %, more preferably 20 to 70% by weight, of an inorganic insulating filler.

The base material can be generally selected from woven fabrics of known glass fibers. Specifically, the glass fibers include generally known glass fibers such as E, S, D, N, T and quartzes. While the weaving method thereof can be selected from known methods, a plain weaving, a mat weaving and a twill weaving are preferably used. Woven fabrics obtained by an opening of a fabric prepared by any one of these weaving methods are preferably used. The glass woven fabrics are selected from glass woven fabrics having a thickness of 25 to 150 µm, a weight of 15 to 165 g/m$^2$ and a gas permeability of 1 to 20 cm$^3$/cm$^2$/sec.

The resin of the thermosetting resin composition used in the present invention can be selected from generally known thermosetting resins. Specific examples thereof include an epoxy resin, a polyfunctional cyanate ester resin, a polyfunctional maleimide-cyanate ester resin, a polyfunctional maleimide resin and an unsaturated-group-containing polyphenylene ether resin. These resins are used alone or in combination. In view of the form of a through hole formed by processing by the irradiation with a high-output carbon dioxide gas laser, the use of a thermosetting resin composition having a glass transition temperature of 150° C. or more is preferred. In view of humidity resistance, anti-migration properties and electric characteristics after moisture absorption, the use of a polyfunctional cyanate ester resin composition is preferred.

A polyfunctional cyanate ester compound which is a thermosetting resin component in the present invention refers to a compound having at least 2 cyanato groups per molecule. Specific examples thereof include 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4-dicyanatobiphenyl, bis(4-dicyanatophenyl)methane, 2,2-bis (4-cyanatophenyl)propane, 2,2-bis(3,5-dibromo-4-cyanatophenyl)propane, bis(4-cyanatophenyl)ether, bis(4-cyanatophenyl)thioether, bis(4-cyanotophenyl)sulfone, tris (4-cyanatophenyl)phosphite, tris(4-cyanatophenyl) phosphate, and cyanates obtained by reacting novolak with cyan halide.

Besides the above compound, the above resin can be also selected from polyfunctional cyanate ester compounds disclosed in Japanese Patent Publications Nos. 41-1928, 43-18468, 44-4791, 45-11712, 46-41112 and 47-26853 and JP-A 51-63149. Further, there may be used a prepolymer having a molecular weight of 400 to 6,000 and having a triazine ring formed by trimerizing cyanato group of any one of these polyfunctional cyanate ester compounds. The above prepolymer is obtained by polymerizing the above polyfunctional cyanate ester monomer in the presence of an acid such as a mineral acid or a Lewis acid, a base such as sodium alcoholate or tertiary amine, or a salt such as sodium carbonate, as a catalyst. The prepolymer partially contains unreacted monomer and is in the form of a mixture of a monomer and a prepolymer, and the prepolymer in the above form is suitably used in the present invention. When the above resin is used, generally, the resin is dissolved in an organic solvent in which it is soluble.

The epoxy resin can be selected from generally known epoxy resins. Specifically, it includes a liquid or solid bisphenol A type epoxy resin, a bisphenol F type epoxy resin, a phenol novolak type epoxy resin, a cresol novolak type epoxy resin, an alicyclic epoxy resin, a polyepoxy compound obtained by epoxidizing the double bond of butadiene, pentadiene, vinylcyclohexene or dicyclopentyl ether, a polyol, and a polyglycidyl compound obtained by a reaction between a hydroxyl-group-containing silicone resin and epohalohydrin. These resins may be used alone or in combination.

The polyimide resin can be selected from generally known polyimide resins. Specifically, it includes reaction products from polyfunctional maleimides and polyamines, and polyimides having terminal triple bonds, disclosed in JP-B-57-005406.

The above thermosetting resins may be used alone, while it is preferred to use a combination thereof properly in view of a balance of characteristics.

The thermosetting resin composition used in the present invention may contain various additives as required so long as the inherent properties of the composition are not impaired. Examples of the above additives include monomers containing a polymerizable double bond such as an unsaturated polyester and prepolymers thereof; liquid elastic rubbers having a low molecular weight and elastic rubbers having a high molecular weight such as polybutadiene, epoxidized butadiene, maleated butadiene, a butadiene-acrylonitrile copolymer, polychloroprene, a butadiene-styrene copolymer, polyisoprene, butyl rubber, fluorine rubber and natural rubber; polystyrene, an AS resin, an ABS resin, an MBS resin, styrene-isoprene rubber, a polyethylene-propylene copolymer and ethylene tetrafluoride-ethylene hexafluoride copolymers; high-molecular-weight prepolymers or oligomers such as polycarbonate, polyphenylene ether, polysulfone, polyester and polyphenylene sulfide; and polyurethane. These additives are used as required. Further, the above thermosetting resin composition may also contain various additives such as a generally known organic filler, a dye, a pigment, a thickener, a lubricant, an anti-foamer, a dispersing agent, a leveling agent, a photosensitizer, a flame retardant, a brightener, a polymerization inhibitor and a thixotropic agent. These additives may be used alone or in combination as required. A curing agent or a catalyst is incorporated into a compound having a reactive group, as required.

The thermosetting resin composition used in the present invention undergoes curing itself under heat. However, since its curing rate is low, it is poor in workability and economic performances, etc. Therefore, a known heat-curing catalyst may be incorporated into the thermosetting resin. The amount of the catalyst per 100 parts by weight of the thermosetting resin is 0.005 to 10 parts by weight, preferably 0.01 to 5 parts by weight.

The inorganic insulating filler can be selected from generally known fillers. Specifically, it includes silicas such as natural silica, calined silica and amorphous silica, white carbon, titanium white, aerogel, clay, talc, wollastonite, natural mica, synthetic mica, kaolin, magnesia, alumina, perlite, aluminum hydroxide and magnesium hydroxide. The amount of the above filler is 10 to 80% by weight, preferably 20 to 70% by weight. The average particle diameter thereof is preferably 1 µm or less.

The copper foil used as the outermost layers can be selected from generally known copper foils. Preferably, an electrolytic copper foil having a thickness of 3 to 12 µm is used. As a copper foil used as an internal layer, an electrolytic copper foil having a thickness of 9 to 35 µm is preferably used.

The glass fabric base copper-clad laminate is prepared as follows. First, the above glass fabric base material is impregnated with a thermosetting resin composition, and the composition is dried and B-staged to form a prepreg which preferably has a glass content of 25 to 70 wt %. A predetermined number of the so-obtained prepregs are provided, copper foils are placed on the upper and lower surfaces of the prepregs, and the resultant set is laminate-formed under heat and under pressure, whereby a double-side copper-clad laminate is obtained. The above copper-clad laminate has a cross section where the resin and the inorganic filler other than glass are homogeneously dispersed. Therefore, a hole is uniformly made with a laser. Further, the glass is uniformly disposed so that the roughness of a hole wall is decreased when the hole is made with a laser. Further, a copper-clad multi-layered board obtained by forming circuits on the double-side copper-clad laminate, surface-treating the copper foils as required, providing the same prepreg(s) and laminate-forming the resultant set, has the similar characteristics.

The copper surface of the glass fabric base copper-clad laminate in a hole-forming portion to be irradiated with a carbon dioxide gas laser is treated to form a metal oxide or treated with a chemical. Otherwise, a coating or a sheet of a resin composition containing at least one powder selected from the group consisting of a metal compound powder, a carbon powder and metal powder is disposed on the above copper surface. The resultant copper surface is directly irradiated with a carbon dioxide gas laser having a diameter focussed to an intended diameter, to make a hole in the copper foil on the front surface or the copper foil on the reverse surface. As a backup sheet, it is preferred to use a sheet obtained by forming a resin layer on a metal sheet having a surface gloss in view of preventing the occurrence of deformation of a hole portion on the reverse surface due to the reflection of a penetrated carbon dioxide gas laser.

When a penetration hole or a via hole is made by several pulses of irradiation with a carbon dioxide gas laser at an output energy preferably selected from 20 to 60 mJ/pulse, burrs occur around the hole. After the irradiation with the carbon dioxide gas laser, therefore, both the copper foil surfaces of the copper-clad laminate are two-dimensionally etched to remove part of the thickness thereof and at the same time to remove the burrs. The resultant copper foils are suitable for forming fine patterns thereon, the penetration hole is plated, and the copper foils suitable for a high-density printed wiring board are retained around the hole on both the surfaces.

In the present invention, an oxidation treatment to form a metal oxide, which treats a copper foil surface where a hole is to be made by direct irradiation with a carbon dioxide gas laser, can be selected from generally known treatments. Specifically, a treatment to form black copper oxide, a MM treatment (supplied by MacDarmid), and the like, are preferably used. The treatment with a chemical is also selected from generally known treatments. Example thereof includes a CZ treatment (supplied by Meck K.K.). Further, a resin composition containing a metal compound powder, a carbon powder or a metal powder is disposed on the copper foil surface and used for a direct formation of a hole in the copper foil with a carbon dioxide gas laser. The metal oxide powder is selected from powders of metal compounds having a melting point of 900° C. or more and a bond energy of 300 kJ/mol or more. Specifically, oxides are used. The oxides include titanias such as titanium oxide, magnesias such as magnesium oxide, oxides of iron such as iron oxide, oxides of nickel such as nickel oxide, oxides of zinc such as zinc oxide, silicon dioxide, manganese dioxide, aluminum oxide, rare earth metal oxides, oxides of tin such as tin oxide and oxides of tungsten such as tungsten oxide. Non-oxides may be also used. The non-oxides include generally known non-oxides such as silicon carbide, tungsten carbide, boron nitride, silicon nitride, titanium nitride, aluminum nitride and barium sulfate. Carbon may be also used. Further, there may be used simple substances of silver, aluminum, bismuth, cobalt, copper, iron, manganese, molybdenum, nickel, tin, titanium and zinc or alloys of these. These are used alone or in combination. The average particle diameter of these is not specially limited, while it is preferably 1 µm or less. The amount of these is not specially limited, while it is 3 to 97 vol %. These are incorporated into an organic substance, particularly a resin composition, and used. The resin composition is preferably selected from water-soluble resins in view of removing the remains after laser-processing. Although not specially limited, the water-soluble resin is selected from those which do not peel off when they are kneaded, coated on a copper foil surface and dried or formed into a sheet. For example, the water-soluble resin includes generally known resins such as polyvinyl alcohol, polyester, polyether and starch.

The method of preparing composition containing a metal compound powder, a carbon powder or a metal powder and a resin is not critical. There are used methods such as a method of kneading materials without any solvent at a high temperature with a kneader, etc., and extruding the kneaded mixture in the form of a sheet to bond it to a thermoplastic film surface, and a method of dissolving a water-soluble resin in water, adding the above powder thereto, homogeneously mixing them with stirring, applying the mixture as a coating composition to a thermoplastic film and drying it to form a coating or directly applying it to a copper foil surface and drying it to form a coating. The thickness is not specially limited, while the thickness of the coating is preferably 30 to 100 µm. When the mixture is bonded to the film, a sheet having a total thickness of preferably 30 to 200 µm is formed. When the sheet is formed, a resin layer is preferably disposed on a copper foil side and the resultant set is preferably laminated under heat and pressure for use.

Concerning a backup sheet, preferably, the above water-soluble resin layer is disposed on the reverse surface of the copper-clad board, a metal sheet is disposed on the outside thereof, and a hole is made. It is preferred to use the water-soluble resin by bonding it to a copper foil.

In the present invention, the method of removing the copper burrs occurring on the hole portions by etching is not specially limited, while it includes methods of dissolving and removing a metal surface with a chemical (called a SUEP method) disclosed, for example, in JP-A-02-22887, JP-A-02-22896, JP-A-02-25089, JP-A-02-25090, JP-A-02-59337, JP-A-02-60189, JP-A-02-166789, JP-A-03-25995, JP-A-03-60183, JP-A-03-99491, JP-A-04-199592 and JP-A-04-263488. The etching is carried out at a rate of 0.02 to 1.0 μm/second.

A carbon dioxide gas laser generally uses a wavelength of 9.3 to 10.6 μm in an infrared wavelength region. The copper-clad board of the present invention may be also used in processing with a UV laser. The UV laser generally preferably uses a wavelength of 200 to 400 nm.

Further, the method of forming a hole by processing is not specially limited. Specifically, when a penetration hole is made, a mechanical drill, a laser, etc., is used. When a hole for a via hole is made, a sandblasting method, a router, a laser, etc., may be used.

EXAMPLES

The present invention will be explained more in detail with reference to Examples and Comparative Examples hereinafter. In Examples and Comparative Examples, "part" stands for "part by weight" unless otherwise specified.

Example 1

900 Parts of 2,2-bis(4-cyanatophenyl)propane and 100 parts of bis(4-meleimidephenyl)methane were melted at 150° C. and allowed to react for 4 hours with stirring, to prepare a prepolymer. The prepolymer was dissolved in mixed solvents of methyl ethyl ketone and dimethylformamide. To this solution were added 400 parts of a bisphenol A type epoxy resin (trade name: Epikote 1001, supplied by Yuka-Shell Epoxy K.K.) and 600 parts of a cresol novolak type epoxy resin (trade name: ESCN-220F, supplied by Sumitomo Chemical Co., Ltd.), and these materials were homogeneously dissolved and mixed. Further, as a catalyst, 0.4 part of zinc octylate was added, and these materials were dissolved and mixed. To the resultant mixture were added 500 parts of an inorganic insulating filler (trade name: Calcined Talc, average particle diameter 0.4 μm, supplied by Nippon Talc K.K.) and 8 parts of a black pigment, and these materials were homogeneously stirred and mixed to prepare a varnish A. The above varnish A was used to impregnate a twilled glass woven fabric having a thickness of 40 μm, a weight of 27 g/m$^2$ and a gas permeability of 19 cm$^3$/cm$^2$/sec., and the impregnated twilled glass woven fabric was dried at 150° C. to prepare prepreg (prepreg B) having a gelation time of 120 seconds at 170° C. and having a glass fabric content of 40% by weight. Three sheets of the prepregs B were stacked, 12 μm thick electrolytic copper foils were placed on the upper and lower surfaces of the stacked prepregs, and the resultant set was laminate-formed at 200° C. at 20 kgf/cm$^2$ under a vacuum of 30 mmHg or less for 2 hours, to obtain a double-side copper-clad laminate B having an insulation layer thickness of 136 μm.

Separately, 800 Parts of a black copper oxide powder having an average particle diameter of 0.86 μm was added to a varnish prepared by dissolving a polyvinyl alcohol powder in water, and these materials were homogeneously stirred and mixed (varnish C). The varnish C was applied to one surface of the above double-side copper-clad laminate to form a coating having a thickness of 30 μm, and the coating was dried at 110° C. for 30 minutes to obtain a coating having a metal oxide content of 50 vol %. A backup sheet is obtained by applying a water-soluble polyester resin on a 100 μm thick aluminum foil having a surface gloss to form a coating having a thickness of 100 μm. The backup sheet was placed on the other surface. The resultant upper surface was 3 pulses (shots) irradiated directly with a carbon dioxide gas laser at an output of 35 mJ/pulse to form 900 penetration holes having a diameter of 100 μm each. Copper foil burrs around the holes were dissolved and removed by the SUEP method, and at the same time, the copper foil on the surface was dissolved until the copper foil had a thickness of 4 μm. Copper was plated on the resultant board by a known method to form a 15 μm thick layer (total thickness: 19 μm). Circuits (line/space=50/50 μm) were formed on the surface, and lands for solder balls, and the like were formed on the reverse surface according to a known method. Portions other than the semiconductor chip-mounting portion, a bonding pad portion and a solder ball pad portion were coated with a plating resist, and nickel plating and gold plating were carried out to obtain a printed wiring board having a square size of 25 mm×25 mm. A semiconductor chip having a square size of 4 mm×4 mm was mounted on the semiconductor-mounting portion of the printed wiring board with a silver paste, followed by wire-bonding and encapsulation with a resin, to obtain a semiconductor plastic package. Tables 1 and 2 show the evaluation results.

Example 2

1,400 Parts of an epoxy resin (trade name: Epikote 5045), 600 parts of an epoxy resin (trade name: ESCN-220F), 70 parts of dicyandiamide and 2 parts of 2-ethyl-4-methylimidazole were dissolved in mixed solvents of methyl ethyl ketone and dimethylformamide, to give a varnish D. The varnish D was used to impregnate a twilled glass woven fabric having a thickness of 130 μm, a weight of 136 g/m$^2$ and a gas permeability of 3 cm$^3$/cm$^2$/sec., and dried to give prepreg (prepregs E) having a gelation time of 120 seconds and having a glass fabric content of 50 wt % and prepregs F having a gelation time of 136 seconds and having a glass fabric content of 45 wt %. One sheet of the prepreg E was provided, a 70 μm thick electrolytic copper foil was placed on one surface of the prepreg E, and the resultant set was laminate-formed at 190° C. at 20 kgf/cm$^2$ under a vacuum of 30 mmHg or less for 2 hours, to obtain a single-side copper-clad laminate. The insulating layer thereof had a thickness of 140 μm. Circuits were formed on this copper surface, followed by a treatment to form copper oxide. Then, sheets of the above prepreg F were placed on both the surfaces, one sheet on one surface and one sheet on the other surface, release films were placed thereon, and the resultant set was similarly laminate-formed to obtain a board having one copper foil layer as an internal layer.

A ball pad portion on the reverse surface was 2 pulses (shots) irradiated with a carbon dioxide gas laser at an output of 17 mJ/pulse to form via holes. Holes were made in a bonding pad portion on the front surface so as to reach the internal copper foil according to a sandblasting method. After desmearing treatment, Example 1 was repeated to complete a printed wiring board having a square size of 25 mm×25 mm. A semiconductor chip having a square size of 15 mm×15 mm was mounted on the printed wiring board with a silver paste, wire-bonding was carried out and encapsulation with an epoxy compound was entirely carried out. Tables 1 and 2 show the evaluation results.

Comparative Example 1

In Example 1, no inorganic insulating filler was used, and the varnish A was used to impregnate a twill-woven glass fabric having a thickness of 50 μm, a weight of 48 g/m² and a gas permeability of 180 cm²/cm²/sec., as a glass woven fabric, and dried to give prepreg having a gelation time of 122 seconds and having a glass fabric content of 40 wt %. Two sheets of the prepreg were provided, 12 μm thick electrolytic copper foils were placed on the upper and lower surfaces of the prepregs, and the resultant set was similarly laminate-formed, to obtain a double-side copper-clad laminate having an insulation layer thickness of 129 μm. Thereafter, penetration holes were similarly made by irradiation with a carbon dioxide gas laser, and a printed wiring board was prepared without the SUEP treatment. Similarly, the printed wiring board was used to obtain a semiconductor plastic package. Tables 1 and 2 show the evaluation results.

Comparative Example 2

In Example 2, 2,000 Parts of only Epikote 5045 was used as an epoxy resin, and no inorganic filler was used to prepare a varnish G. The varnish G was used to impregnate a twill-woven glass fabric having a thickness of 100 μm, a weight of 105 g/m² and a gas permeability of 28 cm³/cm²/sec. and dried to give prepreg G having a gelation time of 133 seconds and having a glass fabric content of 45 wt %. Other procedures were carried out in the same manner as in Example 1, and laminate-formation was similarly carried out to obtain a double-side copper-clad laminate having an insulation layer thickness of 115 μm. Thereafter, the SUEP treatment was not carried out, and a printed wiring board and a semiconductor plastic package were obtained in the same manner as in Example 2.

Tables 1 and 2 show the evaluation results.

TABLE 1

|  | Example | | Comparative Example | |
|---|---|---|---|---|
|  | 1 | 2 | 1 | 2 |
| Form of holes | Almost Circular | Almost Circular | Almost Circular | Almost Circular |
| Form of hole walls | Almost no roughness | Almost no roughness | remarkable roughness | remarkable roughness |
| Pattern breakage and short circuit, number | 0/200 | 0/200 | 50/200 | 52/200 |
| Glass transition temperature, °C. | 235 | 160 | 235 | 139 |
| Through hole · via hole-heat cycle test, % | | | | |
|  | 2.5 | — | 15.9 | 5.3 |
| Insulation resistance value after pressure cooker treatment, Ω | | | | |
| Normal state | $5 \times 10^{14}$ | — | — | $6 \times 10^{14}$ |
| 200 hours | $6 \times 10^{12}$ | | | $3 \times 10^{8}$ |
| 500 hours | $3 \times 10^{11}$ | | | $<10^{8}$ |
| 750 hours | $6 \times 10^{10}$ | | | |
| 1,000 hours | $4 \times 10^{10}$ | | | |
| Surface roughness, μm | 0.6 | 0.7 | 1.8 | 2.2 |

TABLE 2

|  | Example | | Comparative Example | |
|---|---|---|---|---|
|  | 1 | 2 | 1 | 2 |
| Anti-migration properties, Ω | | | | |
| Normal state | $3 \times 10^{13}$ | — | — | $4 \times 10^{13}$ |
| 200 hours | $3 \times 10^{11}$ | | | $1 \times 10^{9}$ |
| 500 hours | $2 \times 10^{11}$ | | | $<10^{8}$ |
| 750 hours | $2 \times 10^{11}$ | | | — |
| 1,000 hours | $8 \times 10^{10}$ | | | |
| Elasticity, $\times 10^{10}$ dyne/cm² | 2.2 | 1.7 | 1.2 | 1.1 |
| Distortion, 250 × 250 mm, printed wiring board | 4 | 3 | 15 | 17 |

<Measurement Methods>

1) Form of Hole Walls, and Time Period for Making Holes

900 Holes/block, each hole having a diameter of 100 μm, were made at intervals of 300 μm in 70 blocks in a work having a square size of 250×250 mm (63,000 holes in total). The form of the holes from a surface and the cross section were observed to check roughness on wall.

2) Circuit Pattern Breakage and Short Circuit

In Examples and Comparative Examples, boards having no holes made were similarly prepared, comb-like patterns having a line/space=50/50 μm were prepared, and then 200 patterns were visually observed through a magnifier after etching. A numerator shows the total of patterns which had a circuit pattern breakage and a short circuit.

3) Glass Transition Temperature and Elasticity

Measured by a DMA method.

4) Through Hole and Via Hole•Heat Cycle Test

A land having a diameter of 200 μl was formed in each through hole, and 900 holes were connected alternately. One cycle consisted of immersion for soldering at 260° C. for 30 seconds and standing at room temperature for 5 minutes, and 200 cycles were repeated. The maximum value of change ratios of resistance values was shown.

5) Insulation Resistance Value after Pressure Cooker Treatment

A comb-shaped pattern between terminals (line/space=50/50 μm) was formed, after a chemical treatment, one sheet of each prepreg used was placed thereon, and the resultant set was laminate-formed. The resultant laminate was treated at 121° C. at 203 kPA for a predetermined period of time and then treated at 25° C. at 60% RH for 2 hours. 500 VDC was applied, and 60 seconds after the application, an insulation resistance between terminals was measured.

6) Anti-migration Properties

The test piece in the above 5) was measured for an insulation resistance value between terminals at 85° C. at 85% RH under an applied charge of 50 VDC.

7) Distortion

A printed wiring board having a work size of 250×250 mm, coated with 30 μm-thick solder resist on both sides, was placed on a flat plate and measured for a maximum value of distortion.

8) Surface Roughness

The surface roughness of a copper-clad laminate having 12 μm-thick copper foils on both surfaces was measured with a surface-roughness-measuring device, and the maximum value was shown.

EFFECT OF THE INVENTION

According to the present invention, there is provided a glass fabric base material/thermosetting resin copper-clad laminate comprising prepreg obtained by impregnating a woven fabric having a thickness of 25 to 150 μm, a weight of 15 to 165 g/m² and a gas permeability of 120 cm³/cm²/sec. as a glass fabric base material with a thermosetting resin and drying it. According to the present invention, there is provided a thermosetting resin copper-clad laminate, of which the surfaces are flat and smooth, which has a high elasticity and which is almost free from distortion and warpage when it is used to prepare a remarkably thin printed wiring board.

According to the present invention, there is further provided a copper-clad laminate or multi-layered board having a high elasticity, which laminate or board is obtained by using a polyfunctional cyanate ester composition as a thermosetting resin and incorporating an insulating inorganic filler, wherein each one layer of glass fabric base material/thermosetting resin layers has an insulation layer thickness of 30 to 150 μm. In the copper-clad laminate, with the treatment or the material on one surface to help a $CO_2$ laser drilling, penetration holes and via holes can be formed by direct irradiation with a high-output carbon dioxide gas laser, and the wall of the obtained holes is almost free from roughness and is uniform. There is obtained a printed wiring board excellent in reliabilities such as electric insulation properties of through holes and via holes after moisture absorption and anti-migration properties and also excellent in heat resistance. A semiconductor plastic package comprising the above printed wiring board shows little distortion and excellent connection properties to a mother board.

What is claimed is:

1. A copper-clad laminate of a highly-elastic glass fabric base material/thermosetting resin, comprising:
   at least one prepreg obtained by impregnating a glass fabric base material made of a glass woven fabric having a thickness of 25 to 150 μm, a weight of 15 to 165 g/m² and a gas permeability of 1 to 20 cm³/cm²/sec. with a thermosetting resin composition and drying it; and
   a copper foil placed on the surface of the prepreg,
   wherein a via hole, having a diameter of 0.15 mm or less, is perforated in the copper-clad laminate,
   wherein the thermosetting resin composition contains 10 to 80 wt% of an insulating inorganic filler, and
   wherein the thermosetting resin composition comprises a polyfunctional cyanate ester and a prepolymer of polyfunctional cyanate ester.

2. The copper-clad laminate according to claim 1, wherein the glass fabric base material/thermosetting resin layer of the copper-clad laminate has a thickness of 30 to 150 μm.

* * * * *